(12) United States Patent
Hishiki et al.

(10) Patent No.: US 9,735,106 B2
(45) Date of Patent: Aug. 15, 2017

(54) SEMICONDUCTOR LEAD FRAME, SEMICONDUCTOR PACKAGE, AND MANUFACTURING METHOD THEREOF

(71) Applicant: SH MATERIALS CO., LTD., Tokyo (JP)

(72) Inventors: Kaoru Hishiki, Isa (JP); Ichinori Iidani, Isa (JP)

(73) Assignee: SH MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/156,730

(22) Filed: May 17, 2016

(65) Prior Publication Data
US 2016/0343643 A1    Nov. 24, 2016

(30) Foreign Application Priority Data
May 18, 2015  (JP) ................. 2015-100743

(51) Int. Cl.
*H01L 23/52*     (2006.01)
*H01L 23/528*    (2006.01)
(Continued)

(52) U.S. Cl.
CPC ...... *H01L 23/5283* (2013.01); *H01L 21/4828* (2013.01); *H01L 23/3107* (2013.01);
(Continued)

(58) Field of Classification Search
CPC .......... H01L 23/49503; H01L 21/4828; H01L 23/3107; H01L 23/49541; H01L 23/49582; H01L 24/48; H01L 24/85; H01L 24/29; H01L 24/32; H01L 24/45; H01L 24/83; H01L 24/92; H01L 24/97; H01L 2224/29294; H01L 2224/29339; H01L 2224/32245; H01L 2224/45015; H01L 2224/45144; H01L 2224/45147; H01L 2224/48091; H01L 2224/48247;
(Continued)

(56) References Cited

U.S. PATENT DOCUMENTS 5,847,458 A * 12/1998 Nakamura .......... H01L 21/4828
                                                             257/692
6,238,952 B1 * 5/2001 Lin ..................... H01L 21/4821
                                                             257/E23.046
(Continued)

FOREIGN PATENT DOCUMENTS

JP     11-195742 A     7/1999

*Primary Examiner* — Scott B Geyer
(74) *Attorney, Agent, or Firm* — Locke Lord LLP; Howard M. Gitten

(57) ABSTRACT

A semiconductor lead frame includes a metal plate and a semiconductor chip mounting area provided on a top surface of the metal plate. A first plating layer for an internal terminal is provided around the semiconductor chip mounting area. A second plating layer for an external terminal is provided on a back surface of the metal plate at a location opposite to the semiconductor chip mounting area. The first plating layer includes a fall-off prevention structure for preventing the first plating layer from falling off from an encapsulating resin when the top surface of the metal plate is encapsulated in the encapsulating resin. The second plating layer does not include the fall-off prevention structure.

16 Claims, 13 Drawing Sheets

(51) Int. Cl.
*H01L 23/495* (2006.01)
*H01L 23/00* (2006.01)
*H01L 23/31* (2006.01)
*H01L 21/48* (2006.01)

(52) U.S. Cl.
CPC .. *H01L 23/49503* (2013.01); *H01L 23/49541* (2013.01); *H01L 23/49582* (2013.01); *H01L 24/48* (2013.01); *H01L 24/85* (2013.01); H01L 24/29 (2013.01); H01L 24/32 (2013.01); H01L 24/45 (2013.01); H01L 24/83 (2013.01); H01L 24/92 (2013.01); H01L 24/97 (2013.01); H01L 2224/29294 (2013.01); H01L 2224/29339 (2013.01); H01L 2224/32245 (2013.01); H01L 2224/45015 (2013.01); H01L 2224/45144 (2013.01); H01L 2224/45147 (2013.01); H01L 2224/48091 (2013.01); H01L 2224/48247 (2013.01); H01L 2224/73265 (2013.01); H01L 2224/85439 (2013.01); H01L 2224/85444 (2013.01); H01L 2224/85455 (2013.01); H01L 2224/85464 (2013.01); H01L 2224/92247 (2013.01); H01L 2224/97 (2013.01); H01L 2924/00014 (2013.01); H01L 2924/01028 (2013.01); H01L 2924/01046 (2013.01); H01L 2924/01047 (2013.01); H01L 2924/01079 (2013.01); *H01L 2924/181* (2013.01)

(58) Field of Classification Search
CPC . H01L 2224/73265; H01L 2224/85439; H01L 2224/85444; H01L 2224/85455; H01L 2224/85464; H01L 2224/92247; H01L 2224/97; H01L 2924/00014; H01L 2924/01028; H01L 2924/01046; H01L 2924/01047; H01L 2924/01079; H01L 2924/181; H01L 23/52; H01L 23/522; H01L 23/528; H01L 23/5283; H01L 23/532; H01L 23/53204; H01L 23/53209; H01L 23/53242; H01L 23/53252
See application file for complete search history.

(56) References Cited

U.S. PATENT DOCUMENTS

| | | | | |
|---|---|---|---|---|
| 6,451,627 | B1 * | 9/2002 | Coffman | H01L 21/4832 257/E23.054 |
| 6,498,099 | B1 * | 12/2002 | McLellan | H01L 21/4832 257/E23.043 |
| 6,872,661 | B1 * | 3/2005 | Kwan | H01L 21/4832 257/E23.043 |
| 7,705,444 | B2 * | 4/2010 | Shibata | H01L 23/49541 257/666 |
| 7,875,988 | B2 * | 1/2011 | Shoji | H01L 21/4832 257/797 |
| 8,071,426 | B2 * | 12/2011 | Sirinorakul | H01L 21/4832 257/666 |
| 8,106,493 | B2 * | 1/2012 | Tsui | H01L 23/49503 257/669 |
| 8,501,540 | B2 * | 8/2013 | Yee | H01L 21/4832 438/111 |
| 8,502,357 | B2 * | 8/2013 | Camacho | H01L 21/4832 257/666 |
| 8,928,136 | B2 * | 1/2015 | Watanabe | H01L 23/49548 257/676 |
| 8,957,509 | B2 * | 2/2015 | Do | H01L 23/49575 257/676 |
| 2001/0044198 | A1 * | 11/2001 | Kawashima | H01L 21/563 438/613 |
| 2002/0041011 | A1 * | 4/2002 | Shibata | H01L 23/3107 257/667 |
| 2004/0092129 | A1 * | 5/2004 | Igarashi | H01L 21/4832 438/754 |
| 2005/0124091 | A1 * | 6/2005 | Fukase | H01L 21/4821 438/106 |
| 2007/0108609 | A1 * | 5/2007 | Kang | H01L 21/4832 257/737 |
| 2008/0258278 | A1 * | 10/2008 | Ramos | H01L 24/36 257/676 |
| 2009/0230523 | A1 * | 9/2009 | Chien | H01L 21/4832 257/676 |
| 2009/0230526 | A1 * | 9/2009 | Chen | H01L 21/4832 257/676 |
| 2011/0201159 | A1 * | 8/2011 | Mori | H01L 21/4832 438/123 |
| 2012/0038036 | A1 * | 2/2012 | Chun | H01L 21/4832 257/677 |
| 2012/0205790 | A1 * | 8/2012 | Haga | H01L 21/4842 257/676 |
| 2012/0241962 | A1 * | 9/2012 | Camacho | H01L 23/3107 257/768 |
| 2013/0001804 | A1 * | 1/2013 | Shimanuki | H01L 21/565 257/782 |

* cited by examiner

SEMICONDUCTOR LEAD FRAME, SEMICONDUCTOR PACKAGE, AND MANUFACTURING METHOD THEREOF

CROSS-REFERENCE TO RELATED APPLICATIONS

This patent application is based upon and claims the benefit of priority of Japanese Patent Application No. 2015-100743, filed on May 18, 2015, the entire contents of which are incorporated herein by reference.

BACKGROUND OF THE INVENTION

1. Field of the Invention

The present invention relates to a semiconductor lead frame, a semiconductor package and a manufacturing method of the semiconductor lead frame and the semiconductor package.

2. Description of the Related Art

Downsizing semiconductor packages has been developed mainly for mobile devices. To achieve this, a variety of CSPs (Chip Scale Package) has been launched to market. Among the CSPs, a semiconductor package as disclosed in Japanese Laid-Open Patent Application Publication No. 11-195742, is expected to be an alternative of FPBGA (Fine Pitch Ball Grid Array) because the semiconductor package has a simple configuration, which can reduce the cost, and can have many pins.

In a method of manufacturing the semiconductor package described in Japanese Laid-Open Patent Application Publication No. 11-195742, a lead frame material made of copper is mainly used as a metal material. A semiconductor lead frame is formed so as to have a semiconductor mounting area and wire bonding parts on one surface (top surface), and connection terminals for external devices opposite to the wire bonding parts on the other surface (back surface). The semiconductor lead frame is completed by partially depositing thin layers by a plating process on the wire bonding parts of one surface (top surface), on a surface opposite to the semiconductor mounting area on the other surface (back surface), and on the connection terminals for external devices corresponding to the opposite surface of the wire bonding parts of the other surface (back surface).

FIG. 13 is a diagram illustrating the conventional method of manufacturing the semiconductor package described in Japanese Laid-Open Patent Application Publication No. 11-195742. As illustrated in FIG. 13, a semiconductor chip 160 is mounted on a lead frame (copper material 110), and then electrodes 161 of the semiconductor chip 160 are connected to wire bonding parts 120 of the lead frame through bonding wires 170. After that, the semiconductor chip 160, the bonding wires 170 and the like are encapsulated in an epoxy resin 180 or the like.

FIG. 14 is a diagram illustrating the conventional method of manufacturing the semiconductor package described in Japanese Laid-Open Patent Application Publication No. 11-195742. As illustrated in FIG. 14, the copper material 110 is etched by using a plating layer 130 as an etching mask, which is formed as a surface of an external connection terminal, thereby electrically separating a semiconductor chip mounting part 114 from an external connection terminal part 115. Finally, the semiconductor device is cut into a size of a semiconductor package, and an individual semiconductor package is completed. Here, etching a metal material from an exposed back surface after encapsulating a top surface of the metal material with an epoxy resin is specifically defined as an etchback, and is hereinafter distinguished from an etching for forming a pattern of a lead frame.

FIG. 15 is a diagram illustrating another conventional method of manufacturing a semiconductor package described in Japanese Laid-Open Patent Application Publication No. 11-195742. As illustrated in FIG. 15, in the method of manufacturing the semiconductor package, the copper material 110 widely used in lead frames is used as a metal material, and the plating layers are formed as the wire bonding parts 120 of one surface (top surface), and plating layers 130 are formed on a surface opposite to a semiconductor mounting area and an external connection terminal surface opposite to the wire bonding parts 120 of the other surface (back surface). After that, a mask made of a resist film is formed on the entire surface of the back surface, and a half etching is performed on the top surface of the copper material 110 up to a predetermined depth by using the formed plating layers 130, thereby completing the semiconductor lead frame. Then, after the semiconductor chip 160 is mounted on the semiconductor lead frame and then electrodes 161 of the semiconductor chip 160 are connected to the wire bonding parts 120 of the semiconductor lead frame through the bonding wires 170, the semiconductor chip 160, the bonding wires 170 and the like are encapsulated in the epoxy resin 180.

FIG. 16 is a diagram illustrating still another conventional method of manufacturing a semiconductor package described in Japanese Laid-Open Patent Application Publication No. 11-195742. As illustrated in FIG. 16, the etchback is performed on the copper material 110 by using the plating layers 130 formed as the external connection terminal surface as an etching mask, and the semiconductor chip mounting part 114 and each of the external connection terminal parts 115 are electrically isolated from each other. Finally, the semiconductor devices are cut into a size of a semiconductor package, thereby completing an individual package.

According to the methods of manufacturing the semiconductor packages described in Japanese Laid-Open Patent Application Publication No. 11-195742, because the terminals (the wire bonding parts and the external connection terminal parts) are connected to each other through the metal material or half-etched remaining portions of the metal material until being encapsulated in the resin, and because the metal material or the half-etched remaining portions of the metal material is removed by an etching after encapsulated in the resin, each of the external connection terminals does not have to be connected to a surrounding frame. Due to this, a supporting part like that provided in the conventional lead frame is not needed, which increases the flexibility of a design, for example, like making it possible to arrange two or more rows of the external connection terminals, and the package size can be reduced while a number of pins can be increased.

However, the semiconductor package illustrated in FIG. 14 has low adhesive strength because the internal terminals, which correspond to the wire bonding parts 120, are held by the encapsulating resin, which corresponds to the epoxy resin 180, only by contacts between the internal terminals and the encapsulating resin. This is likely to cause the internal terminals to drop out of the encapsulating resin while etching the metal material in the etchback process after the resin encapsulation, and to increase costs due to a decrease in process yield. Moreover, the terminals are liable to drop out of the encapsulating resin due to an external shock and the like even after completed as the semiconductor package. To solve this, in the semiconductor package as illustrated in FIGS. 15 and 16 and described in Japanese Laid-Open Patent Application Publication No. 11-195742, the method for increasing the adhesive strength is proposed in which each of the internal terminals is formed into a depressed shape by half-etching the metal material from the top surface, thereby increasing contacting surfaces between the terminals and the encapsulating resin. This semiconductor package can increase the adhesive strength between the terminals and the encapsulating resin by forming each of the internal terminals into the depressed shape, but this method increases the cost because an expensive etching solution needs to be prepared for the half-etching, and the half-etching process needs to be added as an additional process.

SUMMARY OF THE INVENTION

Accordingly, embodiments of the present invention aim to provide a semiconductor lead frame, a semiconductor package and methods of manufacturing the semiconductor lead frame and the semiconductor package that can prevent a terminal from dropping out of a resin when etching a metal material by an etchback after resin encapsulation and to manufacture the semiconductor lead frame and the semiconductor package at a low cost without requiring an expensive process.

According to one embodiment of the present invention, there is provided a semiconductor lead frame that includes a metal plate and a semiconductor chip mounting area provided on a top surface of the metal plate. A first plating layer for an internal terminal is provided around the semiconductor chip mounting area. A second plating layer for an external terminal is provided on a back surface of the metal plate at a location opposite to the semiconductor chip mounting area. The first plating layer includes a fall-off prevention structure for preventing the first plating layer from falling off from an encapsulating resin when the top surface of the metal plate is encapsulated in the encapsulating resin. The second plating layer does not include the fall-off prevention structure.

According to another embodiment of the present invention, there is provided a semiconductor package that includes a semiconductor chip mounting part made of a metal column having a reverse tapered cross-sectional shape, and a lead part made of a metal column having a reverse tapered cross-sectional shape and provided around the semiconductor chip mounting part. A semiconductor chip is mounted on a top surface of the semiconductor chip mounting part. A first plating layer for an internal terminal is provided on a top surface of the lead part. A second plating layer for an external terminal is provided on a back surface of the lead part. A bonding wire electrically connects an electrode of the semiconductor chip with the first plating layer. An encapsulating resin encapsulates the semiconductor chip, the first plating layer, and the bonding wire therein. The first plating layer includes a fall-off prevention structure for preventing the first plating layer from falling off from the encapsulating resin. The second plating layer does not include the fall-off prevention structure.

According to another embodiment of the present invention, there is provided a method of manufacturing a semiconductor lead frame. In the method, a top surface and a back surface of a metal plate is covered with a first resist layer and a second resist layer, respectively. A first plating mask is formed by forming a first opening having an inversed trapezoid cross-sectional shape in the first resist layer on the top surface of the metal plate. A first plating layer is deposited on the top surface of the metal plate by using the first plating mask. The first plating mask and the second resist layer are removed. The top surface and the back surface of the metal plate are covered with a third resist layer and a fourth resist layer, respectively. A second plating mask is formed by forming a second opening in the fourth resist layer on the back surface of the metal plate. A second plating layer is deposited on the back surface of the metal plate by using the second plating mask.

According to another embodiment of the present invention, there is provided a method of manufacturing a semiconductor lead frame. In the method, a top surface and a back surface of a metal plate are covered with a first resist layer and a second resist layer, respectively. A first plating mask is formed by forming a first opening in the first resist layer on the top surface of the metal plate. A first plating layer having a roughened surface is deposited on the top surface of the metal plate by using the first plating mask. The first plating mask and the second resist layer are removed. The top surface and the back surface of the metal plate are covered with a third resist layer and a fourth resist layer, respectively. A second plating mask is formed by forming a second opening in the fourth resist layer on the back surface of the metal plate. A second plating layer is deposited on the back surface of the metal plate by using the second plating mask.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are simply illustrative examples and are not restrictive of the invention as claimed.

DETAILED DESCRIPTION OF THE PREFERRED EMBODIMENTS

A description is given below of embodiments of the present invention, with reference to accompanying drawings.

[First Embodiment]

Figure 1:
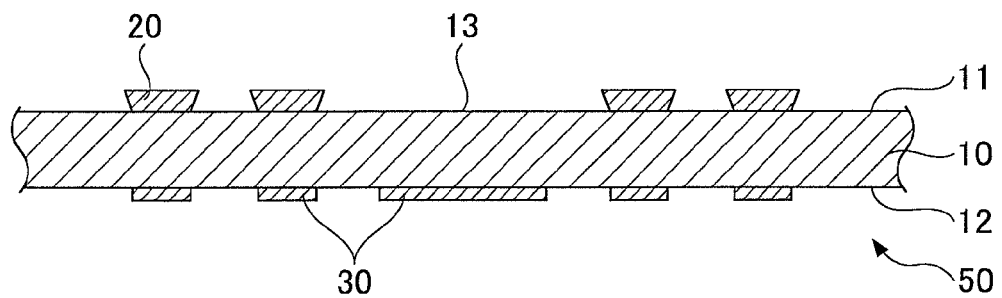
FIG. 1 is a diagram illustrating an example of a semiconductor lead frame according to an embodiment of the present invention.

FIG. 1 is a diagram illustrating an example of a semiconductor lead frame according to a first embodiment of the present invention. The semiconductor lead frame 50 according to the first embodiment includes a metal plate 10, internal-terminal plating layers 20, and external-terminal plating layers 30. Moreover, a semiconductor chip mounting area 13 is provided on a top surface 11 of the metal plate 10. The internal-terminal plating layers 20 are provided around the semiconductor chip mounting area 13. The external-terminal plating layers 30 are provided on a back surface 12 of the metal plate 10 at locations opposite to the internal-terminal plating layers 20 and a location opposite to the semiconductor chip mounting area 13.

Here, in the embodiment, an example of providing the semiconductor chip mounting area 13 but not providing a plating layer is described, but a plating layer similar to the internal-terminal plating layers 20 may be provided on the semiconductor chip mounting area 13.

Although a variety of metal materials may be used in the metal plate 10, for example, a copper material or a copper alloy material may be used, and a metal material having high strength used for a usual lead frame is preferably used. The thickness of the metal plate 10 is preferably selected from a range of 50 to 200 micrometers while considering ease of handling and the like. The metal plate 10 having the thickness in a range of 50 to 150 micrometers may be further preferably used while considering productivity of an etch-back. With respect to the metal plate 10, the surface on which the internal-terminal plating layers 20 are patterned and the semiconductor chip is mounted and electrically connected to the internal-terminal plating layers 20, is hereinafter referred to as the top surface 11, and the surface on which the external-terminal plating layers 30 are patterned to be electrically connected with an external device, is hereinafter referred to as the back surface 12.

The internal-terminal plating layers 20 serve as internal terminals to which electrodes of a semiconductor chip (not illustrated in FIG. 1) mounted on the semiconductor chip mounting area 13 are to be connected by wire bonding. Hence, the internal-terminal plating layers 20 are formed on the top surface 11 of the metal plate 10, on which the semiconductor chip is also mounted, and around the semiconductor chip mounting area 13 so that the electrodes of the semiconductor chip can be connected thereto through bonding wires when the semiconductor chip is mounted on the semiconductor chip mounting area 13.

The internal-terminal plating layers 20 are configured to have a fall-off prevention structure that prevents the internal-terminal plating layers 20 falling off from an encapsulating resin. More specifically, as illustrated in FIG. 1, each of the internal-terminal plating layers 20 has an inverted trapezoid cross-sectional shape, and is configured to have a reverse tapered lateral surface. Forming the internal-terminal plating layers 20 into such a shape can prevent the internal-terminal plating layers 20 from falling off from an encapsulating resin when the top surface 11 of the metal material 10 is covered with the encapsulating resin. In other words, by forming the internal-terminal plating layers 20 into the inverted trapezoid shape, top broadening parts of the internal-terminal plating layers 20 are caught by the encapsulating resin, and the internal-terminal plating layers 20 are unlikely to fall off from the encapsulating resin. The internal-terminal plating layers 20 of the embodiment efficiently prevent the fall-off from the encapsulating resin by being formed into such a shape gradually broadening from a bottom toward the top.

Although a taper angle of the inverted trapezoid shape or the reverse tapered shape of the internal-terminal plating layers 20 may be set at a variety of angles depending on intended use, for example, the taper angle may be set in a range of 30 to 70 degrees. The inverted trapezoid cross-sectional shape and the reverse tapered lateral shape are formed, for example, by using a plating mask formed into such a shape by photolithography. In this regard, a more detailed description will be given later.

The external-terminal plating layers 30 are plating layers to serve as external terminals to which an external device is connected. Because the external-terminal plating layers 30 do not have to be prevented from falling off from the encapsulating resin, the external-terminal plating layers 30 may be formed into plating layers having a usual rectangular cross-sectional shape. Here, the external-terminal plating layers 30 are formed on the back surface 12 of the metal plate 10 at locations opposite to the internal-terminal plating layers 20 and the semiconductor chip mounting area 13.

Figure 2:
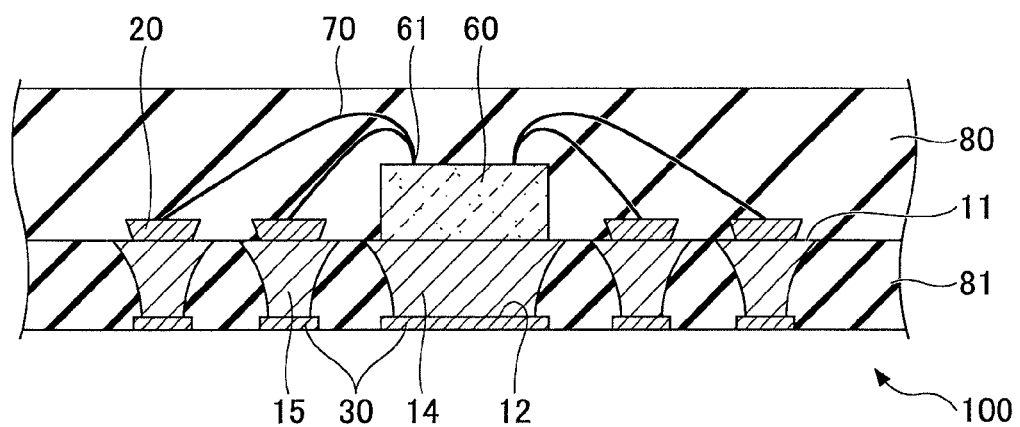
FIG. 2 is a diagram illustrating an example of a semiconductor package according to an embodiment of the present invention.

FIG. 2 is a diagram illustrating an example of a semiconductor package 100 according to a first embodiment of the present invention. The semiconductor package 100 according to the first embodiment includes a semiconductor chip mounting part 14, lead parts 15, internal-terminal plating layers 20, external-terminal plating layers 30, a semiconductor chip 60, bonding wires 70, and encapsulating resins 80 and 81.

The semiconductor chip mounting part 14 and the lead parts 15 are formed by etching the metal plate 10 of the semiconductor lead frame 50 as illustrated in FIG. 1 from the back surface 12 by using the external-terminal plating layers 30 as an etching mask until the semiconductor chip mounting area 13 and each of the internal-terminal plating layers 20 are isolated from each other. The semiconductor chip mounting part 14 and each of the lead parts 15 are formed into metal columns with reverse tapered lateral surfaces. The internal-terminal plating layers 20 are formed on the top surface 11 of the lead parts 15, and the external-terminal plating layers 30 are formed on the back surface 12. Moreover, the semiconductor chip 60 is mounted on the top surface 11 of the semiconductor chip mounting part 14, and the external-terminal plating layer 30 is formed on the back surface 12 of the semiconductor chip mounting part 14.

Furthermore, electrodes 61 of the semiconductor chip 60 are connected to surfaces of the internal-terminal plating layers 20 through the bonding wires 70. An area on and above the top surface 11 of the semiconductor mounting part 14 including the semiconductor chip 60, the lead parts 15, the internal-terminal plating layers 20 and the bonding wires 70, are encapsulated in and covered with the encapsulating resin 80. Also, the lateral surfaces of the semiconductor chip mounting part 14, the lead parts 15 and the external-terminal plating layers 30, are encapsulated in the encapsulating resin 81, but surfaces of the external-terminal plating layers 30 are exposed without being covered with the encapsulating resin 81.

Here, when the semiconductor lead frame 50 in FIG. 1 is processed and formed into the semiconductor package 100 in FIG. 2, after encapsulating the area on and above the top surface 11 of the semiconductor chip mounting part 14 and the lead parts 15 in the encapsulating resin 80, the metal plate 10 is etched from the back surface 12. Then, the semiconductor chip mounting part 14 and each of the lead parts 15 are gradually isolated from each other as the etching makes progress, and only bonding portions between the internal-terminal plating layers 20 supported by the encapsulating resin 80 and the lead parts 15 remain as final supporting (connecting) portions. Because the etching is performed by spraying an etching solution onto the metal plate 10, a certain level of pressure is applied to the metal plate 10. Accordingly, the internal-terminal plating layers 20 and the encapsulating resin 80 need to have adhesive strength that can withstand a pressure caused by the etching. In the semiconductor package 100 according to the embodiment, because each of the internal-terminal plating layers 20 has an inverted trapezoid cross-sectional shape and a reverse tapered lateral surface shape, the lateral surfaces having longer circumferences than the circumferences of the bottom surfaces engage with the encapsulating resin 80, thereby effectively preventing the lead parts 15 from falling off from the encapsulating resin 80.

Although the encapsulating resin 81 on the back surface 12 may be made of the same resin as the encapsulating resin 80 on the top surface 11, or may be made of a different resin from the encapsulating resin 80, the encapsulating resin 81 is preferably made of the same resin as the encapsulating resin 80 in terms of a total consistency.

Next, a description is given below of a method of manufacturing a semiconductor lead frame according to the first embodiment of the present invention.

FIGS. 3A through 3F are diagrams illustrating a first half of a series of processes of the method of manufacturing the semiconductor lead frame according to the first embodiment.

Figure 3A:
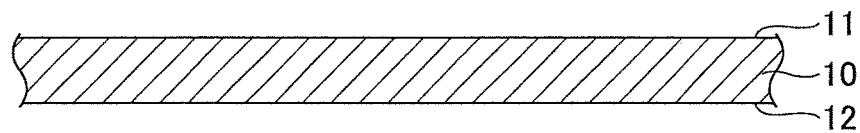
FIGS. 3A through 3F are diagrams illustrating an example of a first half of a series of processes of a method of manufacturing a semiconductor lead frame according to an embodiment of the present invention.

FIG. 3A is a diagram illustrating an example of a metal plate preparation process. In the metal plate preparation process, a metal plate 10 is prepared. As discussed above, for example, a copper plate having a thickness of 50 to 200 micrometers may be used as the metal plate 10.

Figure 3B:
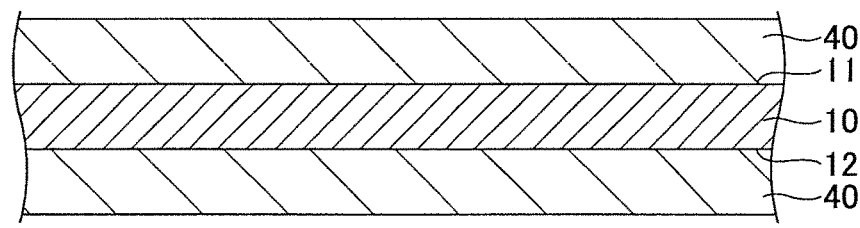

FIG. 3B is a diagram illustrating an example of a first resist layer formation process. In the first resist layer formation process, to begin with, resist layers 40 are formed on both sides of the metal plate 10, and entire surfaces of a top surface 11 and a back surface 12 are covered with the resist layers 40. To form the resist layers 40, a variety of resists may be used, and for example, dry film resists may be laminated on both sides of the metal plate 10. Moreover, although a type and the thickness of the dry film resists are not specifically limited, a negative type resist in which an exposed portion hardens is usually used. In addition to this, however, a positive type dry film resist may be used. Furthermore, a liquid type photo resist may be applied to the metal plate 10. Although the thickness of the resist layers 40 is determined based on a line width and a distance between lines of a pattern to be formed, a resist with a thickness of 15 to 40 micrometers is often used.

Figure 3C:
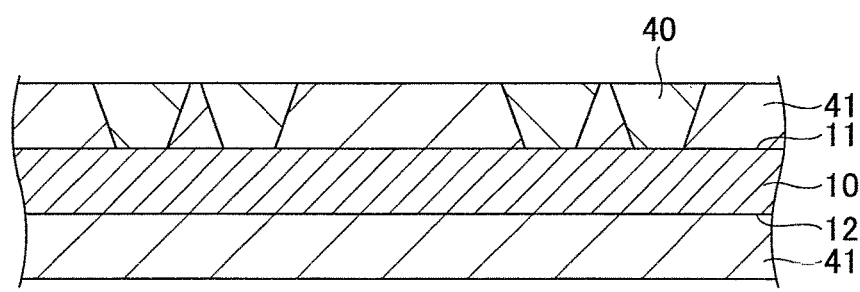

FIG. 3C is a diagram illustrating an example of a first photolithography process. In the first photolithography process, a pattern for forming internal-terminal plating layers 20, each of which has a predetermined shape, at predetermined locations is transferred to the resist layer 40. A patterned photomask (not illustrated in FIG. 3C) is in close contact with the resist layer 40 by using a general method, and the patterned photomask is irradiated with ultraviolet light, thereby transferring the pattern of the photomask to the resist layer 40. At this time, the top surface 11 that later becomes a surface on which a semiconductor chip 60 is to be mounted is distinguished from the opposite back surface 12 that becomes external-connection terminals. A plating pattern for forming the internal-terminal plating layers 20 is transferred to the resist layer 40 on the top surface 11 side by photolithography, and no pattern is transferred to the resist layer 40 on the back surface 12 side by being entirely exposed to ultraviolet light.

During the photolithography, the resist layer 40 is exposed to scattering ultraviolet light, and the scattering ultraviolet light is caused to obliquely enter the resist layer 40, thereby forming a pattern having an inversed trapezoid cross-sectional shape in the resist layer 40. As illustrated in FIG. 3C, scattering ultraviolet light is emitted to the resist layer 40 so that the resist layer 40 that does not harden forms the inversed trapezoid cross-sectional shape, and parts exposed to the scattering ultraviolet light becomes hardened parts 41.

Figure 3D:
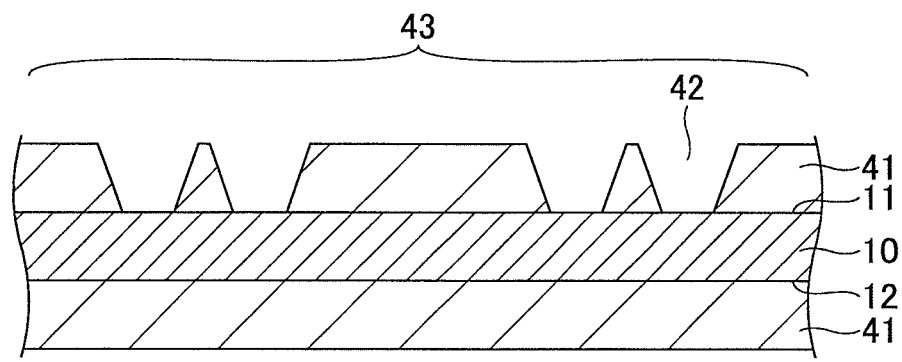

FIG. 3D is a diagram illustrating an example of a first development process. In the first development process, the resist layer 40 after being processed by the photolithography process is developed, and unhardened parts dissolve and are removed, thereby forming openings 42. This causes a plating mask 43 to be formed. When an alkaline development type photoresist is used as the resist layers 40, a specified developer is used. Thus, a resist mask for forming the internal-terminal plating layers 20, which has the openings 42 of predetermined shapes, is formed on the top surface 11 of the metal plate 10.

Here, FIGS. 3B through 3D constitute a first plating mask formation process. The plating mask 43 having the openings 42, each of which has the inversed trapezoid cross-sectional shape, that is, the reverse tapered lateral surface shape, is formed by the first plating mask formation process.

Figure 3E:
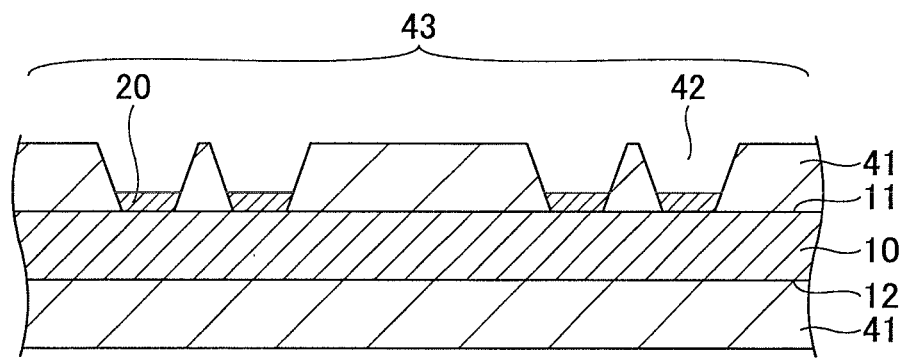

FIG. 3E is a diagram illustrating an example of a first plating process. In the first plating process, plating is performed on the top surface 11 of the metal plate 10 in the openings 42 of the plating mask 43, and the internal-terminal plating layers 20 are deposited. A metal material for the plating is selected by considering heat resistance, wire bonding properties for bonding with the semiconductor chip and the like. A single layer plating of Ni, Pd, Au, Ag or the like, or multi-layer plating including two types of metals or more of Ni, Pd, Au, Ag and the like, is usually formed by electroplating. As discussed above, because each of the openings 42 of the plating mask 43 has the reverse tapered shape, the tapered plating is formed on the top surface 11 of the metal plate 10.

As discussed above, the tapered plating is intended to improve the connection strength between the internal terminals and the encapsulating resin 80 after mounting the semiconductor chip 60 and encapsulating the mounted and wire bonded semiconductor chip in the encapsulating resin 80. For example, by setting a taper angle of the tapered plating in a range from 30 to 70 degrees, the taper plating layers that can sufficiently improve the connection strength can be obtained. When the taper angle of the tapered plating is less than 30 degrees, the encapsulating resin 80 is unlikely to fill a space between the top surface 11 and the internal-terminal plating layers 20, which is liable to generate voids. On the other hand, when the taper angle is more than 70 degrees, the connection strength between the encapsulating resin 80 and the internal-terminal plating layers 20 is insufficient, thereby being liable to generate the fall-off of the internal terminals 20 after an etchback. For example, after improving the adhesive strength with the encapsulating resin 80 by forming the tapered plating layers with Ni, an Au plating layer, an Ag plating layer and a Pd plating layer are plated in this order to form a multi-layered plating layer while considering the wire bonding properties needed to be connected with the semiconductor chip 60.

Figure 3F:
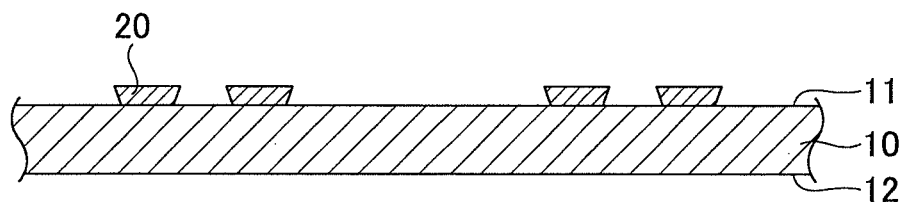

FIG. 3F is a diagram illustrating an example of a first resist layer removing process. In the first resist layer removing process, the plating mask 43 and the resist layer (hardened resist layer) 41 on the back surface 12 are removed. When the alkaline development type photo resist is used in the resist layer 40, a specified resist stripping solution is used.

FIGS. 4A through 4E are diagrams illustrating a second half of a series of processes of the method of manufacturing the semiconductor lead frame according to the first embodiment of the present invention.

Figure 4A:
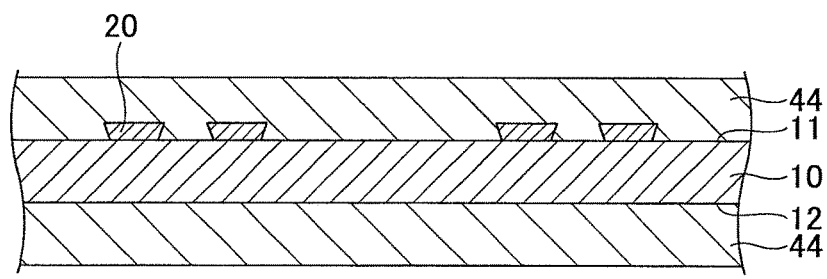
FIGS. 4A through 4E are diagrams illustrating an example of a second half of a series of processes of the method of manufacturing the semiconductor lead frame according to the embodiment of the resent invention.

FIG. 4A is a diagram illustrating an example of a second resist layer formation process. In the second resist layer formation process, resist layers 44 are formed on both surfaces 11 and 12 of the metal plate 10 on which surface 11 the internal-terminal plating layers 20 are patterned. The resist layers 44 may be formed of a variety of resists. For example, the resist layers 44 may be formed by laminating dry resist films. Although a type and the thickness of the dry film resists are not limited, a negative type dry film resist in which an exposed portion hardens is usually used. In addition to this, however, a positive type dry film resist is also available. Moreover, a liquid type photo resist may be applied to the metal plate 10. The thickness of the resist films 44 is determined based on a line width and a distance between lines of a pattern to be formed, a resist with a thickness of 15 to 40 micrometers is often used.

Figure 4B:
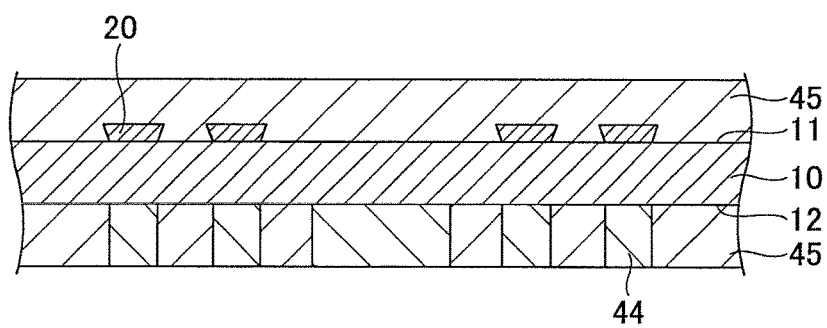

FIG. 4B is a diagram illustrating an example of a second photolithography process. In the second photolithography process, a pattern for forming the external-terminal plating layers 30, each of which has a predetermined shape, at predetermined locations, is transferred to the resist layer 44 by photolithography. A patterned photomask (not illustrated in FIG. 4B) is in close contact with the resist layer 44, and the patterned photomask is irradiated with ultraviolet light by using a general method, thereby transferring the pattern of the photo mask to the resist layer 44. The resist layer 44 laminated on the plating pattern of the internal-terminal plating layers 20 on the top surface 11 side is entirely exposed to ultraviolet light, and the plating pattern for forming the external-terminal plating layers 30 is transferred to the resist layer 44 on the back surface 12 side by the photolithography. Because usual plating layers have to be formed just on the back surface 12, scattering ultraviolet light does not need to be used, but a generic ultraviolet light may be emitted. The resist layer 44 irradiated with ultraviolet light becomes hardened portions 45.

Figure 4C:
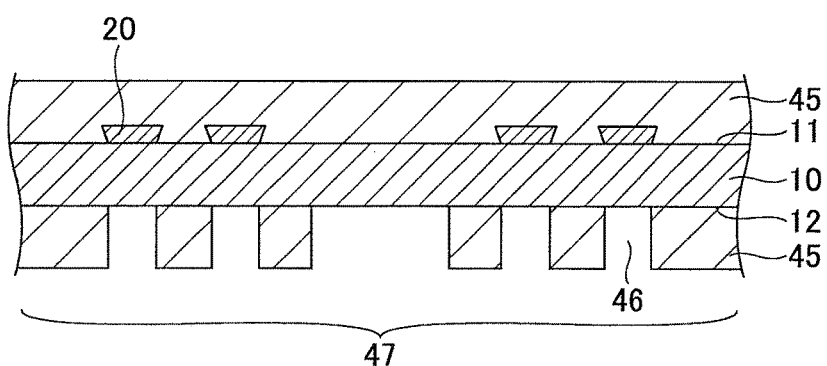

FIG. 4C is a diagram illustrating an example of a second development process. In the second development process, unhardened portions of the resist layer 44 dissolve and are removed by development, and openings 46 are formed. This causes a plating mask 47 to be formed on the back surface 12. When an alkaline development type photo resist is used as the resist layer 44, a specified developer is used.

Thus, the plating mask 47 for the external-terminal plating layers 30 having the openings 46, each of which has the predetermined shape, is formed on the back surface 12 of the metal plate 10. Here, the processes in FIG. 4A through 4C constitute a second mask formation process.

Figure 4D:
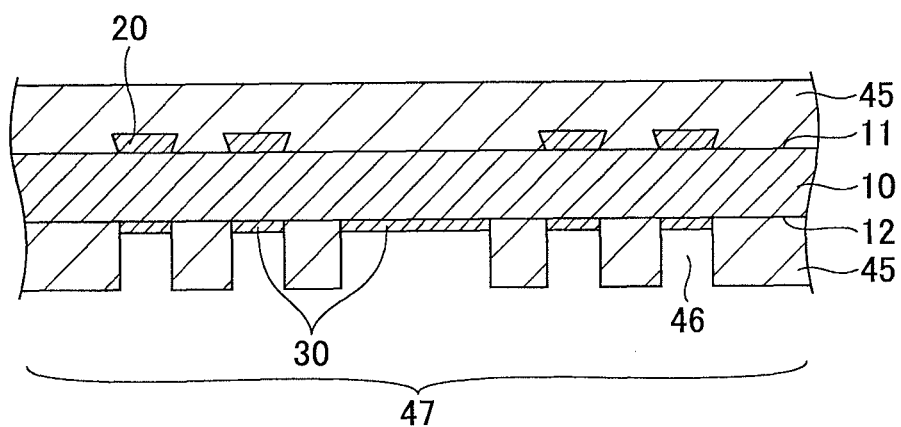

FIG. 4D is a diagram illustrating an example of a second plating process. In the second plating process, plating is performed in the openings 46 of the plating mask 47. A metal material for the plating is selected from metal materials used for a usual electroplating while considering heat resistance, bonding properties with solder to be connected with an external device and the like. For example, a single layer plating, a multi-layer plating selected from Ni, Pd, Au or the like is performed by usual electroplating. For example, a Ni plating layer with a thickness of 0.5 micrometers, a Pd plating layer with a thickness of 0.01 micrometers, and an Au plating layer with a thickness of 0.003 micrometers may be layered. In particular, thick Ni plating layers are preferably formed in order to prevent sags and burrs from being generated at the external-terminal plating layers 30 after the etchback. The thick Ni plating layers are intended to prevent the sags and the burrs from occurring in the external-terminal plating layers 30 after the etchback, and for example, Ni plating layers with a thickness of 2 to 20 micrometers are deposited by a nickel sulfamate bath. After that, by depositing Pd plating layers with a thickness of 0.01 micrometers, and then Au plating layers with a thickness of 0.003 micrometers, the generation of the sags or the burrs in the external-terminal plating layers 30 after the etchback can be prevented. When the thickness of the Ni plating layers is less than 2 micrometers, the sags or the burrs are liable to occur at the external-terminal plating layers 30 after the etchback. On the other hand, when the Ni plating layers are over 20 micrometers, the thickness of the plating layers is excessive, which reduces productivity. Hence, the Ni plating layers may be formed in a range of 2 to 20 micrometers as parts of the external-terminal plating layers 30. Thus, the external-plating layers 30 may be formed of a plurality of plating layers.

Figure 4E:
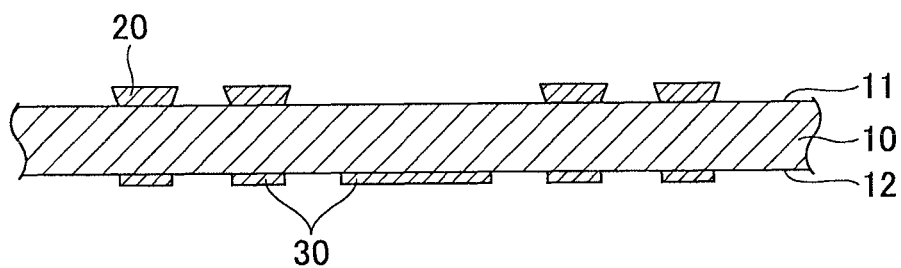

FIG. 4E is a diagram illustrating an example of a second resist layer removing process. In the second resist layer removing process, the resist layer 45 on the top surface 11 side and the plating mask 47 on the back surface 12 side are removed. When an alkaline development type photo resist is used in the resist layer 44, a specified stripping solution is used in the second resist layer removing process.

Next, by cutting the metal plate 10 into a sheet form and cleaning the cut metal plate 10 as necessary, a semiconductor lead frame according to the first embodiment of the present invention is obtained.

Subsequently, a description is given below of a method of manufacturing a semiconductor package using the semiconductor lead frame according to the first embodiment of the present invention.

FIGS. 5A through 5E are diagrams illustrating an example of a series of processes of a method of manufacturing a semiconductor package according to a first embodiment of the present invention.

Figure 5A:
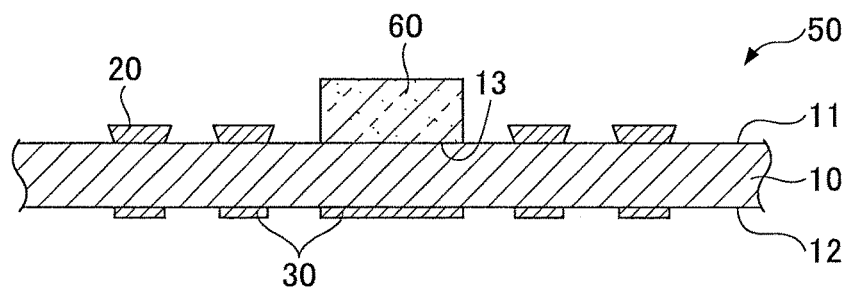
FIGS. 5A through 5E are diagrams illustrating an example of a series of processes of a method of manufacturing a semiconductor package according to an embodiment of the present invention.

FIG. 5A is a diagram illustrating an example of a semiconductor chip mounting process. In the semiconductor chip mounting process, a semiconductor chip 60 is mounted on a semiconductor mounting area 13 of a semiconductor lead frame 50. The semiconductor chip 60 may be mounted on the semiconductor chip mounting area 13 on a top surface 11 of the semiconductor lead frame 50 by using a die paste and the like. An Ag paste and the like are available for the die paste.

Figure 5B:
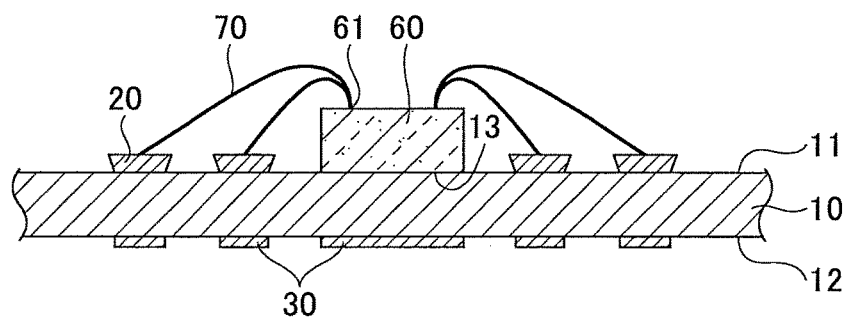

FIG. 5B is a diagram illustrating an example of a wire bonding process. In the wire bonding process, electrodes 61 of the semiconductor chip 60 are electrically connected to internal-terminal plating layers 20 through bonding wires 70. Wires with a diameter of 20 to 40 micrometers such as gold wires or copper wires may be used in the bonding wires 70.

Figure 5C:
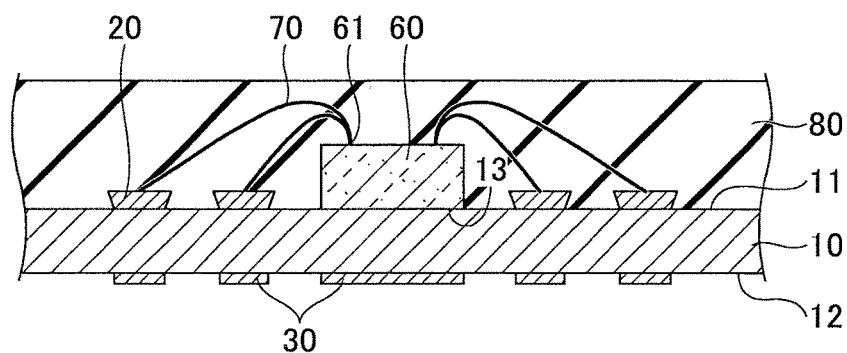

FIG. 5C is a diagram illustrating an example of a first resin encapsulating process. In the first resin encapsulating process, an encapsulating resin 80 is supplied to fill in a space on and above the top surface 11 of the metal plate 10 by using a mold, thereby encapsulating the top surface 11 side, which is the semiconductor chip mounting side, of the metal plate 10. For example, an epoxy resin and the like may be used as the encapsulating resin 80.

Figure 5D:
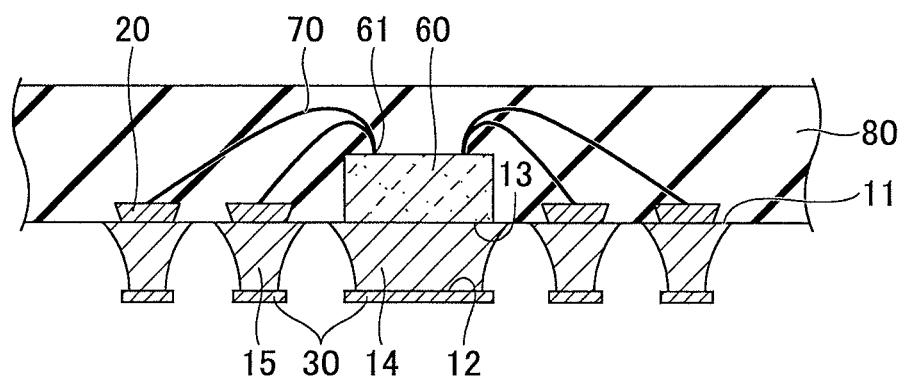

FIG. 5D is a diagram illustrating an example of an etching process. In the etching process, the metal plate 10 is etched from the back surface 12 side by using the external-terminal plating layers 30 as an etching mask. Thus, by processing the metal plate 10 by an etchback process, a semiconductor mounting part 14 and the lead parts 15 are isolated from each other. Here, because the etchback process is performed from the external-terminal plating layer 30 side toward a single direction, the semiconductor chip mounting part 14 and each of the lead parts 15 are formed so as to have an inversed trapezoid cross-sectional shape, that is, a reverse tapered lateral surface shape after the etchback process, thereby preventing the semiconductor chip mounting part 14 and each of the lead parts 15 from falling off from the encapsulating resin 80. For example, in the etching process, a copper selective etching solution used for the etchback process is sprayed onto the back surface 12 of the semiconductor lead frame 50 from a nozzle. At this time, adjustment of a spraying pressure, a spraying period of time and a nozzle swinging angle, and the like, just have to be performed so as to form cross sections of the semiconductor chip mounting part 14 and each of the lead parts 15 into the inversed trapezoid shapes.

Figure 5E:
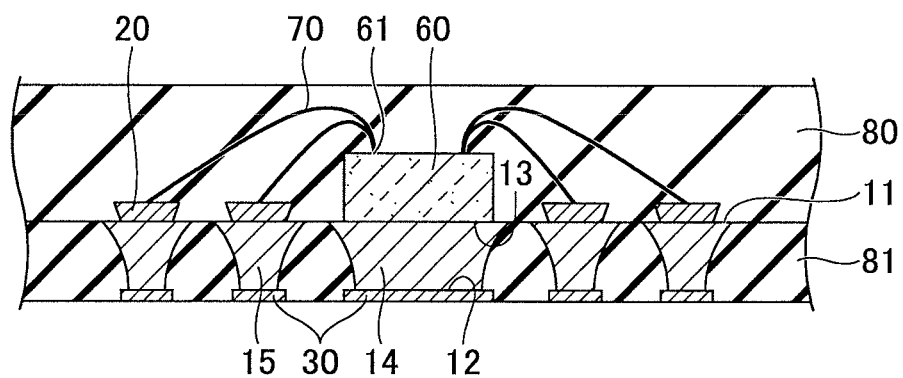

FIG. 5E is a diagram illustrating an example of a second resin encapsulating process. In the second resin encapsulating process, the back surface 12 side of the metal plate 10 after the etchback process is encapsulated with a second resin 81. This second encapsulating process prevents exposed lateral surfaces of the semiconductor chip mounting part 14 and the lead parts 15 by the etchback process, from deteriorating like oxidation, tarnish and the like, and effectively prevents the semiconductor chip mounting part 14 and the lead parts 15 from falling off from the first resin 80 at the same time.

Finally, the semiconductor device is cut into an individual package size by a dicing method and the like. As discussed above, the semiconductor lead frame is obtained without using an etching process in the method of manufacturing the semiconductor lead frame.

According to the semiconductor lead frame, the semiconductor package and the methods of manufacturing the semiconductor lead frame and the semiconductor package of the first embodiment, by forming the internal-terminal plating layers 20 into a structure having an inverted trapezoid cross-sectional shape, the fall-off of the internal-terminal plating layers 20 from the encapsulating resin 80 is effectively prevented. Moreover, by forming the semiconductor mounting part 14 and the lead parts 15 into a reverse tapered shape, the fall-off of the semiconductor chip mounting part 14 and the lead parts 15 including the external-terminal plating layers 30 can be also effectively prevented on the back surface 12 side.

[Second Embodiment]

Figure 6:
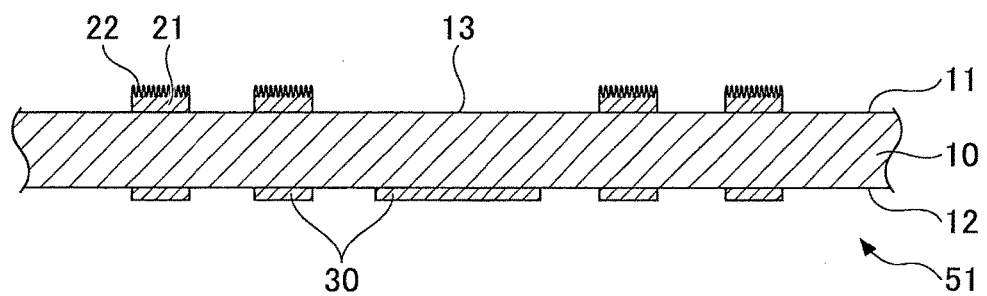
FIG. 6 is a diagram illustrating an example of semiconductor lead frame according to an embodiment of the present invention.

FIG. 6 is a diagram illustrating an example of a semiconductor lead frame according to a second embodiment of the present invention.

In FIG. 6, a semiconductor lead frame 51 according to the second embodiment includes a metal plate 10 and external-terminal plating layers 30 that have the same configuration as those in the semiconductor lead frame 50 according to the first embodiment illustrated in FIG. 1, but includes internal-terminal plating layers 21 configured to be different from the internal-terminal plating layers 20 of the semiconductor lead frame 50 according to the first embodiment.

As illustrated in FIG. 6, each of the internal-terminal plating layers 21 has a rectangular cross-sectional shape similar to each of the external-terminal plating layers 30, but surfaces 22 thereof are roughened. The internal-terminal plating layers 21 can improve adhesive properties with the encapsulating resin 80 by including the roughened surfaces 22.

Roughening the surfaces 22 of the internal-terminal plating layers 21 may be performed by a variety of methods as long as the surfaces 22 can be roughened. For example, the internal-terminal plating layers 21 may be formed by using a roughening plating bath capable of roughening plating. The roughening plating is intended to improve connection strength of the internal-terminal plating layer 21 after mounting the semiconductor chip 60 on the semiconductor lead frame 51 and encapsulating the wire-bonded semiconductor chip in the encapsulating resin 80. For example, by setting surface roughness (Ra) of a Pd plating layer after forming the Pd plating layer by performing chlorine-based Ni roughening plating, in a range from 0.2 to 0.7 micrometers, the roughening plating layers that can sufficiently improve connection strength and perform wire bonding, can be obtained. When the surface roughness (Ra) is less than 0.2 micrometers, the connection strength between the internal-terminal plating layers 21 and the encapsulating resin 80 is insufficient, and the fall-off of the terminal is liable to occur after the etchback process. In contrast, when the surface roughness (Ra) of the plating layer is beyond 0.7 micrometers, the plating layer needs to be made thicker, and productivity decreases. Thus, the surfaces just have to be roughened in the roughening plating, roughening plating of a single layer of Pd or the like or multi-layer plating of performing noble metal plating such as Pd, Au, Ag and the like on the roughening plating layer of Ni and the like.

In addition, although an example of the internal-terminal plating layers 21 having the rectangular cross-sectional shape has been described in the above, the cross-sectional shape of the internal-terminal plating layers 21 is not limited to the rectangular shape. For example, as described in the first embodiment, the cross-sectional shape may be an inverted trapezoid shape. In this case, the connection strength of the internal-terminal plating layers 21 can be further improved due to effects of the shapes and the roughened surfaces.

The semiconductor lead frame 51 according to the second embodiment can effectively prevent the internal-terminal plating layers 21 from falling off from the encapsulating resin 80 due to such a configuration. Because components other than the internal-terminal plating layers 21 are substantially the same as the components of the semiconductor lead frame 50 according to the first embodiment, the same numerals are used in the corresponding components, and the description is omitted.

Figure 7:
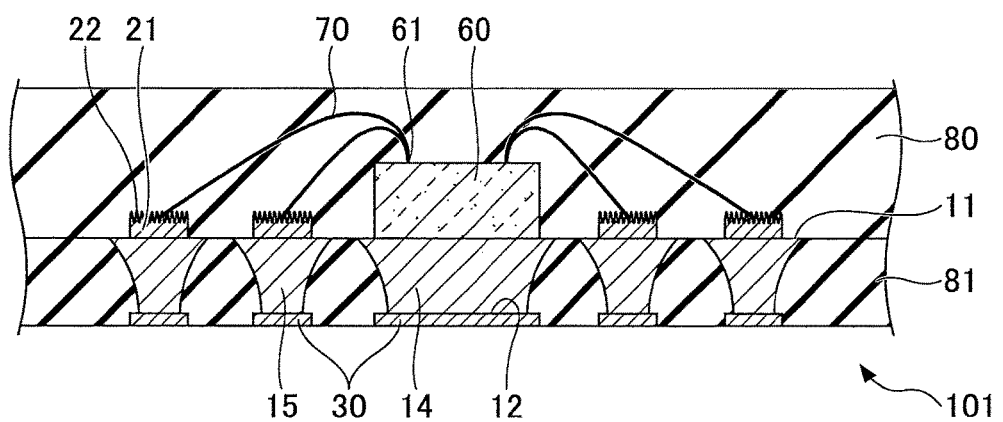
FIG. 7 is a diagram illustrating an example of a semiconductor package according to an embodiment of the present invention.

FIG. 7 is a diagram illustrating and example of a semiconductor package 101 according to the second embodiment of the present invention. The semiconductor package 101 according to the second embodiment is the same as the semiconductor package 100 according to the first embodiment in that the surfaces 22 of the internal-terminal plating layers 21 are roughened and that the bonding properties with the encapsulating resin 80 are sufficiently enhanced. Here, because other components are substantially the same as the components of the semiconductor package 100 according to the first embodiment, the same numerals are used in the corresponding components, and the description is omitted.

Next, a description is given below of a method of manufacturing a semiconductor lead frame according to the second embodiment. With respect to the method of manufacturing the semiconductor lead frame according to the second embodiment, different points from the method of manufacturing the semiconductor lead frame according to the first embodiment are mainly described. The description is omitted or simplified with respect to the same or similar points to the first embodiment.

FIGS. 8A through 8F are diagrams illustrating an example of a series of processes of a method of manufacturing a semiconductor lead frame according to the second embodiment of the present invention.

Figure 8A:
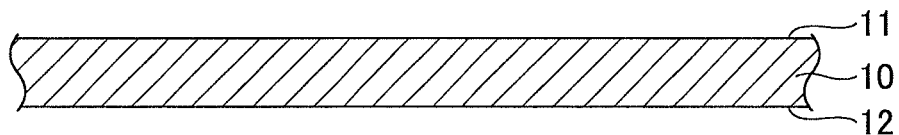
FIGS. 8A through 8F are diagrams illustrating an example of a series of processes of a method of manufacturing a semiconductor lead frame according to an embodiment of the present invention.
Figure 8B:
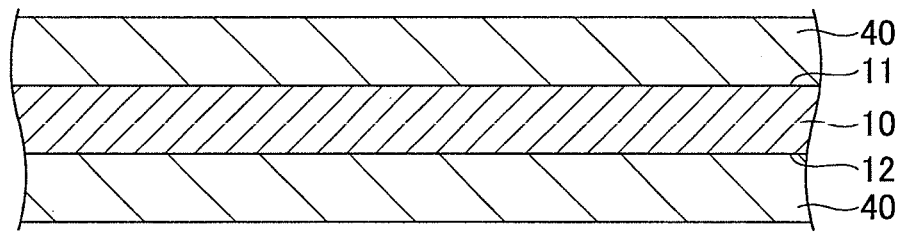

FIG. 8A is a diagram illustrating an example of a metal plate preparation process. FIG. 8B is a diagram illustrating an example of a resist layer formation process. Because the metal plate preparation process and the resist layer formation process are the same as those of the method of manufacturing the semiconductor lead frame of the first embodiment illustrated in FIGS. 3A and 3B, respectively, the same numerals are used in the corresponding components and the description is omitted.

Figure 8C:
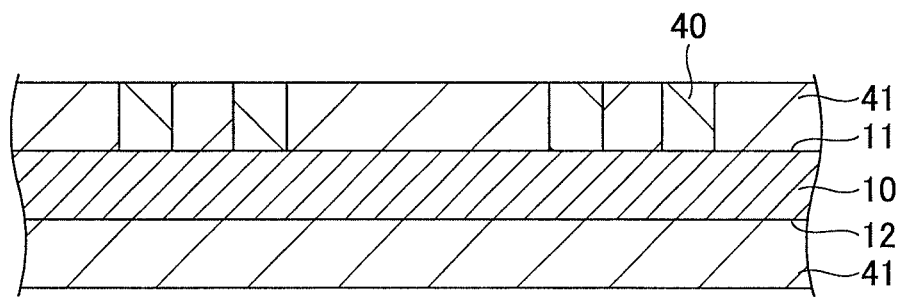

FIG. 8C is a diagram illustrating an example of a first photolithography process. In the first photolithography process, generic ultraviolet light is used without using scattering ultraviolet light, which is different from the first embodiment. Hence, hardened portions 41 of a resist layer 40 are formed so as to have lateral surfaces substantially perpendicular to a top surface 11 of a metal plate 10 by being perpendicularly irradiated with ultraviolet light from above. Because the other points are the substantially the same as the description of FIG. 3C, the description is omitted.

Figure 8D:
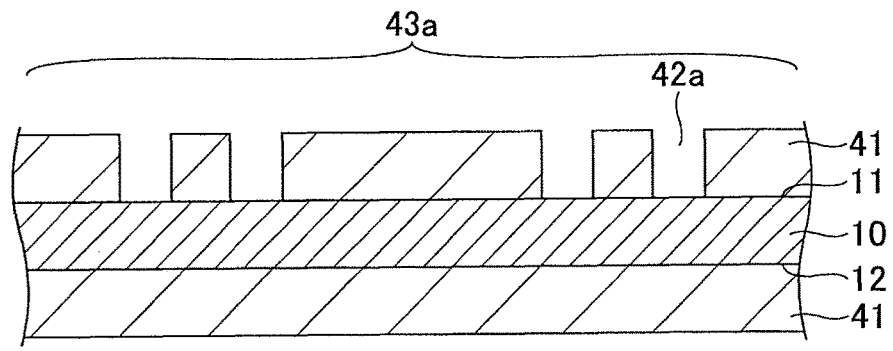

FIG. 8D is a diagram illustrating an example of a first development process. Openings 42a formed by development have lateral surfaces substantially perpendicular to the top surface 11 of the metal plate 10. Because the other points are the substantially the same as the description of FIG. 3D, the description is omitted. Also, FIGS. 8B through 8D constitute a first plating mask formation process as well as FIGS. 3B through 3D.

Figure 8E:
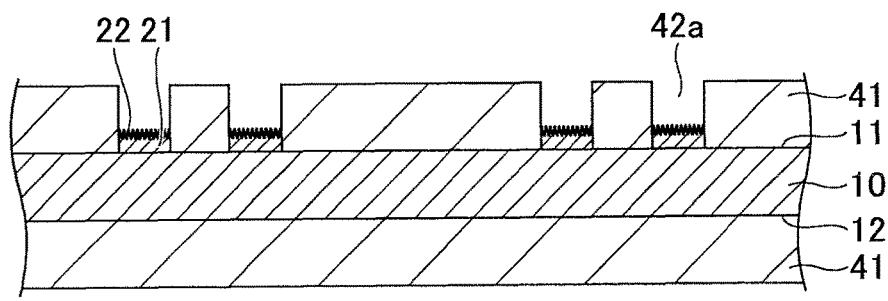

FIG. 8E is a diagram illustrating an example of a first plating process. In the first plating process, internal-terminal plating layers 21 are formed by a plating process using a roughening plating bath to form roughened surfaces 22. The roughening plating is intended to improve connection strength of internal terminals after mounting a semiconductor chip, performing wire bonding, and encapsulating the semiconductor chip. For example, by setting surface roughness (Ra) of plating surfaces after forming Pd plating layers by a chlorine-based Ni roughening plating process, in a range of 0.2 to 0.7 micrometers, the roughening plating layers that can sufficiently improve the connection strength are obtained. Furthermore, after forming the Ni roughening plating, an Au plating layer, and Ag plating layer and a Pd plating layer are generally stacked on the Ni roughening plating layer while considering wire bonding properties performed to connect the semiconductor chip to the internal-terminal plating layers 21.

Figure 8F:
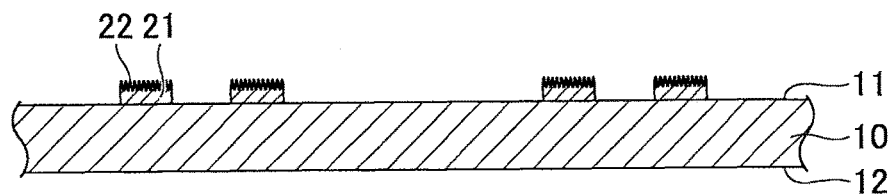

FIG. 8F is a diagram illustrating an example of a first resist layer removing process. Because this process is substantially the same as the method of manufacturing the semiconductor lead frame according to the first embodiment illustrated in FIG. 3F, the same numerals are used in the corresponding components and the description is omitted.

After that, substantially the same processes as the processes as illustrated in FIGS. 4A through 4E of the method of manufacturing the semiconductor lead frame 50 according to the first embodiment just have to be performed in series. By doing this, the semiconductor lead frame 51 having the high adhesive properties between the encapsulating resin 80 and the internal-terminal plating layers 21 can be manufactured.

Because a method of manufacturing the semiconductor package 101 according to the second embodiment is substantially the same as the method of manufacturing the semiconductor package 100 according to the first embodiment described in FIGS. 5A through 5E except that the internal-terminal plating layers 21 have different configurations from those of the first embodiment, the description is omitted.

[Third Embodiment]

Figure 9:
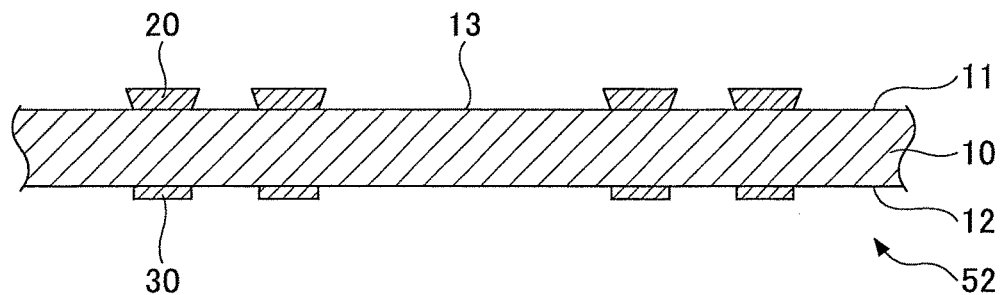
FIG. 9 is a diagram illustrating an example of a semiconductor lead frame according to an embodiment of the present invention.

FIG. 9 is a diagram illustrating an example of a semiconductor lead frame 52 of a third embodiment of the present invention. The semiconductor lead frame 52 according to the third embodiment differs from the semiconductor lead frame 50 according to the first embodiment in that an external-terminal plating layer 30 is not formed on a back surface 12 at a location opposite to a semiconductor chip mounting area 13 on a top surface 11.

Thus, providing the external-terminal plating layer 30 on the back surface 12 side of the semiconductor chip mounting area 13 is not necessarily required, a configuration as illustrated in FIG. 9 is possible. Because other components are substantially the same as the components of the semiconductor lead frame 50 according to the first embodiment, the same numerals are used in the corresponding components and the description is omitted.

Figure 10:
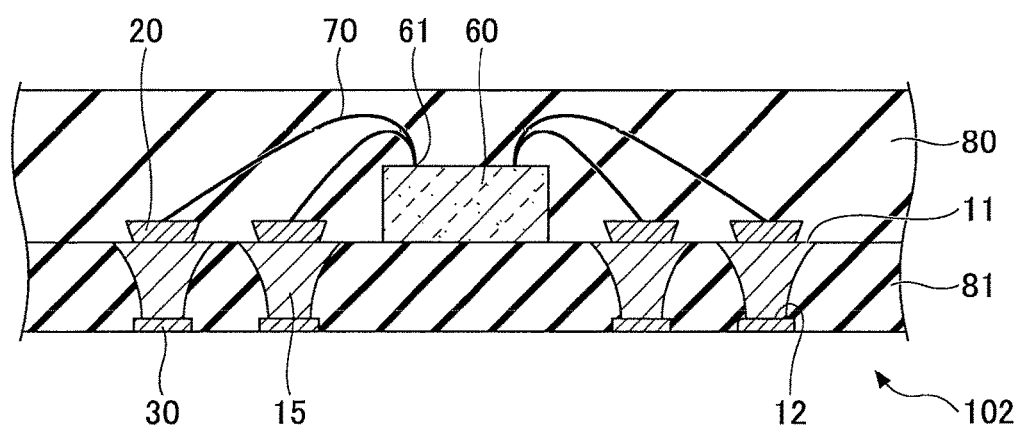
FIG. 10 is a diagram illustrating an example of a semiconductor package according to an embodiment of the present invention.

FIG. 10 is a diagram illustrating an example of a method of manufacturing a semiconductor package 102 according to the third embodiment of the present invention. The semiconductor package 102 according to the third embodiment differs from the semiconductor package 100 according to the first embodiment in that the semiconductor package 102 does not include a semiconductor chip mounting part 14 formed by processing the metal plate 10. Thus, providing a semiconductor chip 60 on the semiconductor chip mounting part 14 is not necessarily required, and the semiconductor chip mounting part 14 may be removed by an etching, and the semiconductor chip 60 may be held by resins 80 and 81.

A method of manufacturing a semiconductor lead frame according to the third embodiment is described by modifying the method of manufacturing the semiconductor lead frame according to the first embodiment illustrated in FIGS. 4A through 4E. That is, in the second plating mask forming process illustrated in FIGS. 4B through 4D, the resist layer 44 opposite to the semiconductor chip mounting area 13 is replaced by the hardened portion 45, and the opening 46 just has not to be formed at the location opposite to the semiconductor chip mounting area 13.

Moreover, a method of manufacturing a semiconductor package according to the third embodiment is substantially the same as the method of manufacturing the semiconductor package described in FIGS. 5A through 5E, and differs from the method of manufacturing the semiconductor package described in FIGS. 5A through 5E only in that the semiconductor chip mounting area 13 of the metal plate 10 is removed by an etching in the etching process in FIG. 5D.

[Fourth Embodiment]

Figure 11:
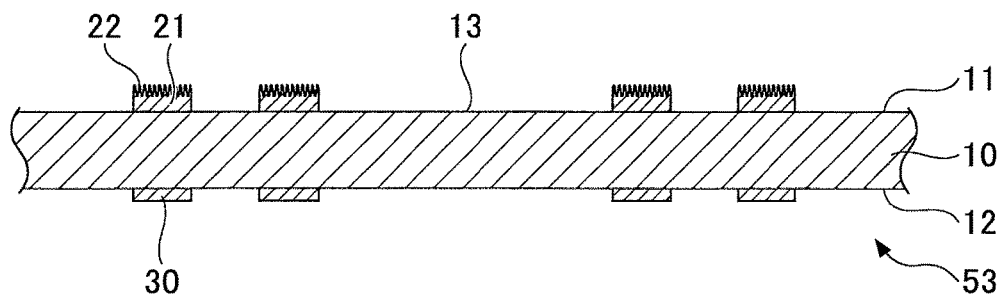
FIG. 11 is a diagram illustrating an example of a semiconductor lead frame according to an embodiment of the present invention.

FIG. 11 is a diagram illustrating an example of a semiconductor lead frame 53 according to a fourth embodiment of the present invention. The semiconductor lead frame 53 according to the fourth embodiment differs from the semiconductor lead frame 51 according to the second embodiment in that an external-terminal plating layer 30 is not formed on a back surface 12 at a location opposite to a semiconductor chip mounting area 13 on a top surface of a metal plate 10.

Thus, providing the external-terminal plating layer 30 on the back surface 12 at the location opposite to the semiconductor chip mounting area 13 is not necessarily required, and a configuration as illustrated in FIG. 11 is possible. Because other components are substantially the same as the components of the semiconductor lead frame 51 according to the second embodiment, the same numerals are used in the corresponding components and the description is omitted.

Figure 12:
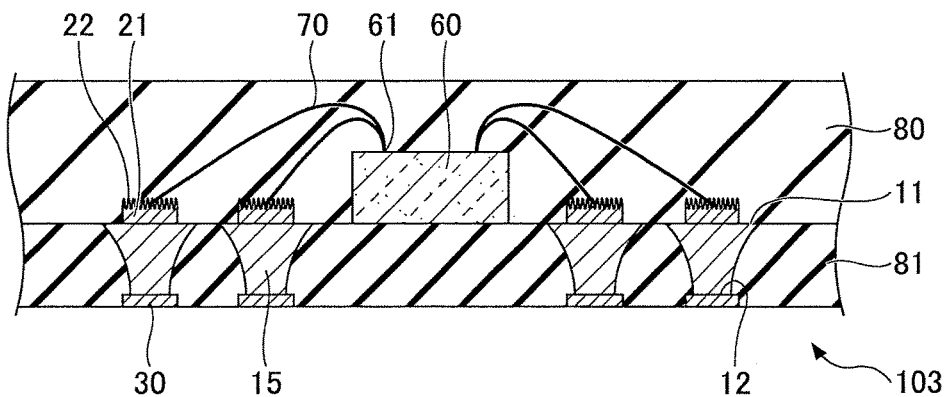
FIG. 12 is a diagram illustrating an example of a semiconductor package according to an embodiment of the present invention.
Figure 13:
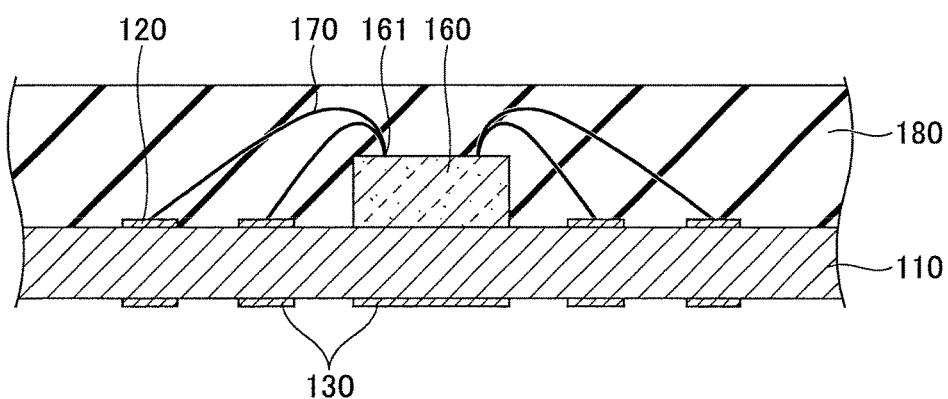
FIG. 13 is a diagram illustrating a first conventional method of manufacturing a semiconductor package.
Figure 14:
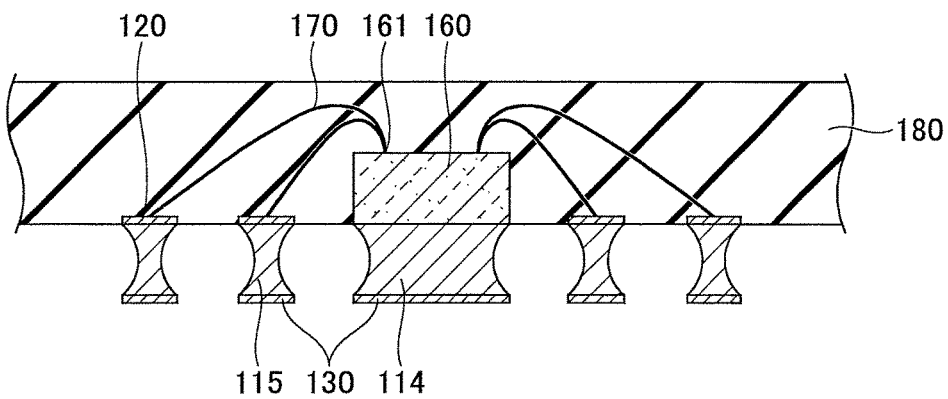
FIG. 14 is a diagram illustrating the first conventional method of manufacturing the semiconductor package.
Figure 15:
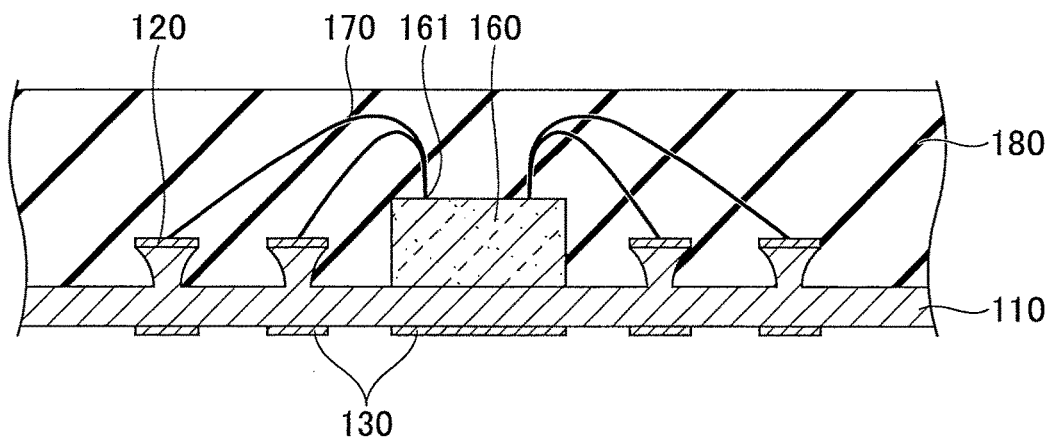
FIG. 15 is a diagram illustrating a second conventional method of manufacturing a semiconductor package.
Figure 16:
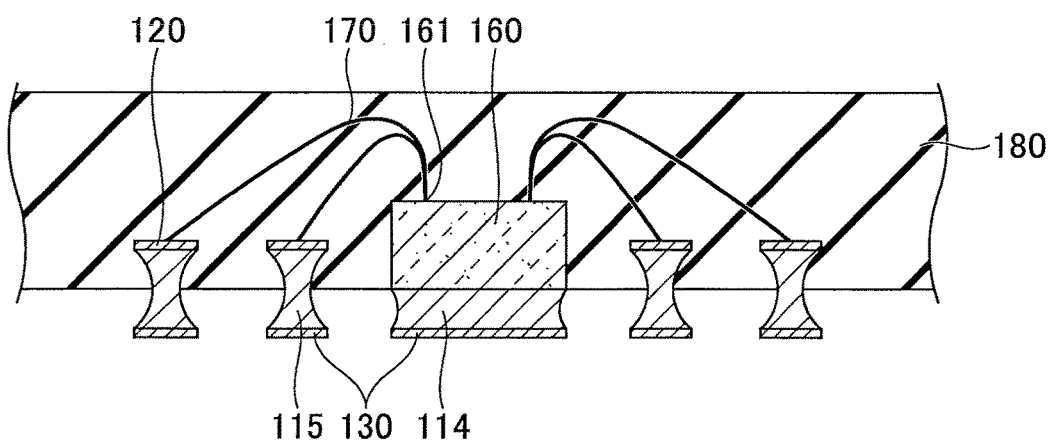
FIG. 16 is a diagram illustrating the second conventional method of manufacturing the semiconductor package.

FIG. 12 is a diagram illustrating an example of a semiconductor package 103 according to the fourth embodiment. The semiconductor package 103 according to the fourth embodiment differs from the semiconductor package 101 according to the second embodiment in that the semiconductor package 103 does not include a semiconductor chip mounting part 14 formed by processing a semiconductor plate 10. Thus, providing a semiconductor chip 60 on the semiconductor chip mounting part 14 is not necessarily required, and the semiconductor chip mounting part 14 may be removed in an etching process, and the semiconductor chip 60 may be held by resins 80 and 81.

A method of manufacturing the semiconductor lead frame according to the fourth embodiment is provided by modifying the method of manufacturing the semiconductor lead frame according to the second embodiment illustrated in FIGS. 4A through 4E. That is, in the second plating mask forming process illustrated in FIGS. 4B through 4D, the resist layer 44 opposite to the semiconductor chip mounting area 13 is replaced by the hardened portion 45, and the opening 46 just has not to be formed at the location opposite to the semiconductor chip mounting area 13.

Moreover, a method of manufacturing a semiconductor package according to the fourth embodiment is substantially the same as the method of manufacturing the semiconductor package described in FIGS. 5A through 5E, and differs from the method of manufacturing the semiconductor package described in FIGS. 5A through 5E only in that the semiconductor chip mounting area 13 of the metal plate 10 is removed by an etching in the etching process in FIG. 5D.

WORKING EXAMPLES

Working Example 1

Next, working examples of the semiconductor lead frame and the method of manufacturing the semiconductor lead frame are described below in accordance with the process flows illustrated in FIGS. 8A through 8F, 4A through 4E and 5A through 5E.

A copper alloy material (Product No.: EFTEC64-T, made by Furukawa Electric Co., Ltd) with a thickness of 0.125 mm was used as the metal plate 10, and dry film resists (Product No.: 2358, made by Asahi Kasei Corp.) were laminated on both sides of the metal plate 10 (see FIGS. 8C and 8D).

Next, both surfaces were exposed to light by photolithography and a predetermined pattern was transferred to the dry film resist 40 on a top surface 11. A plating mask 43a having openings 42a at locations that need internal-terminal plating layers 21 to be provided, was formed by developing the exposed dry film resist 40 (see FIGS. 8C and 8D).

Subsequently, the exposed portions of the metal plate 10 at the openings 42a were plated with roughened Ni layers of a thickness of 5 micrometers by using a chlorine-based nickel bath, and then with Pd layers of a thickness of 0.01 micrometers in series, and the internal-terminal plating layers 21 ware formed (see FIG. 8E).

Next, the plating mask 43a and the resist layers 41 were removed (see FIG. 8F).

Here, surface roughness (Ra) of the plating obtained as the internal-terminal plating layers 21 was 0.2 micrometers. With respect to measurement of the surface roughness, the surface roughness (Ra) was measured by using a measurement device (Product No.: QLS3000, made by Olympus Corporation) (see FIG. 8F).

Next, dry film resists 44 (Product No.: 2358, made by Asahi Kasei Corp.) were laminated on both sides of the metal plate 10 (see FIG. 4A).

Subsequently, both surfaces were exposed to light by photolithography and a predetermined pattern was transferred to the dry resist film 44 on a back surface 12. A plating mask 47 having openings 46 at locations that need external-terminal plating layers 30 to be provided, was formed by developing the exposed dry film resist 44 (see FIGS. 4B and 4C).

Next, exposed portions of the metal plate 10 at the openings 46 were plated with Ni layers of a thickness of 2 micrometers by using a nickel sulfamate bath, and with Pd layers of a thickness of 0.01 micrometers, and with Au layers of a thickness of 0.003 micrometers in series, and the external-terminal plating layers 30 ware formed (see FIG. 4D).

Next, the plating mask 47 and the resist layers 45 were removed (see FIG. 4E).

Subsequently, the semiconductor lead frame was cut into a sheet form, and was cleaned as necessary. Thus, the lead frame of the working example was obtained.

Next, a semiconductor chip 60 was mounted on the semiconductor lead frame 51 obtained by the above processes and was electrically connected to the internal-terminal plating layers 20 by wire bonding, and first resin encapsulation was performed by encapsulating the surface 11 in an epoxy resin 80 (see FIGS. 5A through 5C).

Next, the metal plate 10 was etched by an etchback process by using the external-terminal plating layers 30 formed on the back surface 12 as an etching mask (see FIG. 5D).

Next, second resin encapsulation was performed by encapsulating the back surface 12 in an epoxy resin 81 except for surfaces of the external-terminal plating layers 30 (see FIG. 5E).

After that, the semiconductor lead frame package was divided into small pieces of individual semiconductor packages by sawing.

Working Examples 2-5 and Comparative Example

TABLE 1 shows settings of working examples 2-5 and a comparative example.

TABLE 1

| | INTERNAL TERMINAL | ADHESIVENESS OF INTERNAL-TERMINAL PLATING LAYER | APPEARANCE OF EXTERNAL-TERMINAL PLATING LAYER |
|---|---|---|---|
| WORKING EXAMPLE 1 | SURFACE ROUGHNESS (Ra)0.2 μm | ○ | ○ |
| WORKING EXAMPLE 2 | SURFACE ROUGHNESS (Ra)0.7 μm | ○ | ○ |
| WORKING EXAMPLE 3 | TAPER ANGLE 30° | ○ | ○ |
| WORKING EXAMPLE 4 | TAPER ANGLE 70° | ○ | ○ |
| WORKING EXAMPLE 5 | SURFACE ROUGHNESS (Ra)0.2 μm | ○ | ○ |
| COMPARATIVE EXAMPLE | RECTANGULAR CROSS-SECTIONAL SHAPE | x | ○ |

In the working example 2, surface roughness (Ra) of the inner-terminal plating layers 21 was set at 0.7 micrometers as shown in TABLE 1. The other working examples 3-5 were manufactured by the same method as the working example 1.

In the working example 3, as described in FIG. 3C, openings 42 having an inversed trapezoid cross-sectional shape were formed by using scattering light in the photolithography process when forming a pattern for a plating mask 43 in a resist layer 40 (see FIG. 3D). After that, a plating process was performed, and a taper angle of the internal-terminal plating layers 20 was set at 30 degrees as indicated in TABLE 1 (see FIG. 2F). The taper angle was measured by using a measuring microscope (Product No.: MM-60, made by Nikon Corporation), and was calculated from the measured value. The other components were manufactured by the same method as the working example 1.

In the working example 4, the taper angle of the inter-terminal plating layers 20 was set at 70 degrees as indicated in TABLE 1 similar to the working example 3. The other components were manufactured by the same method as the working example 1.

In the working example 5, with respect to plating of the external-terminal plating layers 30, the external-terminal plating layers 30 was formed by plating corresponding portions with Ni 20 micrometers thick, Pd 0.01 micrometers thick, and Au 0.003 micrometers thick in series (see FIG. 3D). The other components were manufactured by the same method as the working example 1.

In the comparative example, as indicated in TABLE 1, the internal-terminal plating layers was formed to have a generally rectangular cross-sectional shape, and the surfaces were not roughened. The other components were manufactured by the same method as the working example 1.

Next, to check the effects, adhesive properties between the internal-terminal plating layers 20, 21 and the encapsulating resin of the working examples 1-5 were checked, and appearances of the external-external plating layers 30 were checked to observe generation of sags and burrs.

With respect to the check of the adhesive properties of the internal-terminal plating layers 20, 21 with the encapsulating resin, whether a failure of the internal-terminal plating layers 20, 21 falling off from the encapsulating resin occurs or not while etching the metal material in the etchback process after the resin encapsulation, was checked. When the fall-off failure did not occur, a circles was indicated in TABLE 1. When the fall-off failure partially occurred, a cross was indicated in TABLE 1. In all of the working examples 1-5, the fall-off failure did not occur, while several failures of the internal-terminal plating layers falling off from the encapsulating resin occurred in the comparative example. The result has indicated that the semiconductor lead frame and the semiconductor package of the working examples 1-5 can effectively prevent the internal-terminal plating layers 20 and 21 from falling off from the encapsulating resin.

Furthermore, after completing the semiconductor package, conditions of the metal layer of the external-terminal plating layers 30 and the surrounding encapsulating resin provided in the bottom surface of the semiconductor package were observed by a microscope. When a sag and/or a burr were not generated in the external-terminal plating layers 30, a circle was indicated in TABLE 1. When the sag and/or the burr were generated in the external-terminal plating layers 30, a cross was indicated in TABLE 1.

As shown in TABLE 1, the sag and/or the burr of the encapsulating resin and the electrode terminals were not found in all samples of the working examples 1-5 and the comparative example, and a preferable result was obtained.

Thus, the samples of the working examples 1-5 indicated preferable results in the adhesive properties with the encapsulating resin and the appearances of the external terminals.

According to the semiconductor lead frame, the semiconductor package and the methods of manufacturing the semiconductor lead frame and the semiconductor package of the embodiments of the present invention, the semiconductor lead frame can be manufactured at a low cost without using an etching process for forming a lead frame pattern, and terminals can be prevented from falling off from an encapsulating resin by an etchback process after resin encapsulation. Moreover, a highly reliable semiconductor package that can prevent the terminals from falling off from the resin even when an external shock or the like is applied thereto, can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:
1. A semiconductor lead frame comprising:
a metal plate;
a semiconductor chip mounting area provided on a top surface of the metal plate;

a first plating layer for an internal terminal provided around the semiconductor chip mounting area; and
a second plating layer for an external terminal provided on a back surface of the metal plate at a location opposite to the semiconductor chip mounting area,
wherein the first plating layer includes a fall-off prevention structure for preventing the first plating layer from falling off from an encapsulating resin when the top surface of the metal plate is encapsulated in the encapsulating resin, the fall-off prevention structure of the first plating layer including a reverse tapered lateral surface that causes a cross-sectional shape of the first plating layer to be formed into an inversed trapezoid shape tapered toward the metal plate, and
wherein the second plating layer does not include the fall-off prevention structure.

2. The semiconductor lead frame as claimed in claim 1, wherein a taper angle of the reverse tapered lateral surface is in a range of 30 to 70 degrees.

3. The semiconductor lead frame as claimed in claim 1, wherein the fall-off prevention structure of the first plating layer is a roughened surface formed in an upper surface of the first plating layer.

4. The semiconductor lead frame as claimed in claim 3, wherein the first plating layer is made of a multi-layer plating layer.

5. The semiconductor lead frame as claimed in claim 3, wherein the roughened surface is formed from a roughening plating bath.

6. The semiconductor lead frame as claimed in claim 5, wherein a surface toughness (Ra) of the first plating layer is not less than 0.2 micrometers and not more than 0.7 micrometers.

7. The semiconductor lead frame as claimed in claim 1, wherein the first plating layer is thicker than the second plating layer.

8. The semiconductor lead frame as claimed in claim 1, wherein the second plating layer has a rectangular cross-sectional shape and a flat surface smoother than a roughened surface of the first plating surface.

9. A semiconductor lead frame comprising:
a metal plate;
a semiconductor chip mounting area provided on a top surface of the metal plate;
a first plating layer for an internal terminal provided around the semiconductor chip mounting area; and
a second plating layer for an external terminal provided on a back surface of the metal plate at a location opposite to the semiconductor chip mounting area,
wherein the first plating layer includes a fall-off prevention structure for preventing the first plating layer from falling off from an encapsulating resin when the top surface of the metal plate is encapsulated in the encapsulating resin, wherein the second plating layer does not include the fall-off prevention structure, and wherein the second plating layer is made of a multi-layer plating layer including a Ni plating layer, a Pd plating layer, and an Au plating layer stacked on and from the back surface of the metal plate in this order.

10. The semiconductor lead frame as claimed in claim 9, wherein the Ni plating layer has a thickness of not less than 2 micrometers and not more than 20 micrometers.

11. A semiconductor package comprising:
a semiconductor chip mounting part made of a metal column having a reverse tapered cross-sectional shape;
a lead part made of a metal column having a reverse tapered cross-sectional shape and provided around the semiconductor chip mounting part;
a semiconductor chip mounted on a top surface of the semiconductor chip mounting part;
a first plating layer for an internal terminal provided on a top surface of the lead part;
a second plating layer for an external terminal provided on a back surface of the lead part;
a bonding wire electrically connecting an electrode of the semiconductor chip with the first plating layer;
an encapsulating resin encapsulating the semiconductor chip, the first plating layer, and the bonding wire therein,
wherein the first plating layer includes a fall-off prevention structure for preventing the first plating layer from falling off from the encapsulating resin, and
wherein the second plating layer does not include the fall-off prevention structure.

12. The semiconductor package as claimed in claim 11, wherein the fall-off prevention structure of the first plating layer includes a reverse tapered lateral surface that causes a cross-sectional shape of the first plating layer to be formed into an inversed trapezoid shape tapered toward the metal plate.

13. The semiconductor package as claimed in claim 11, wherein the fall-off prevention structure of the first plating layer is a roughened surface formed in an upper surface of the first plating layer.

14. A method of manufacturing a semiconductor lead frame comprising steps of:
covering a top surface and a back surface of a metal plate with a first resist layer and a second resist layer, respectively;
forming a first plating mask by forming a first opening having an inversed trapezoid cross-sectional shape in the first resist layer on the top surface of the metal plate;
depositing a first plating layer on the top surface of the metal plate by using the first plating mask;
removing the first plating mask and the second resist layer;
covering the top surface and the back surface of the metal plate with a third resist layer and a fourth resist layer, respectively;
forming a second plating mask by forming a second opening in the fourth resist layer on the back surface of the metal plate; and
depositing a second plating layer on the back surface of the metal plate by using the second plating mask.

15. The method of manufacturing the semiconductor lead frame as claimed in claim 14, further comprising:
removing the second plating mask and the third resist layer.

16. A method of manufacturing a semiconductor package comprising steps of:
mounting a semiconductor chip on a predetermined area on the top surface of the semiconductor lead frame manufactured by the method as claimed in claim 14;
connecting an electrode of the semiconductor chip with the first plating layer of the semiconductor lead frame by wire bonding;
encapsulating the top surface of the semiconductor lead frame including the semiconductor chip in a first resin;
forming a metal column having a tapered lateral surface by etching the metal plate from the back surface by using the second plating mask as an etching mask; and encapsulating the back surface of the metal plate in a second resin.

\* \* \* \* \*